United States Patent
Miki et al.

(10) Patent No.: US 8,115,212 B2
(45) Date of Patent: Feb. 14, 2012

(54) POSITIVE ELECTRODE FOR SEMICONDUCTOR LIGHT-EMITTING DEVICE

(75) Inventors: Hisayuki Miki, Ichihara (JP); Noritaka Muraki, Ichihara (JP); Munetaka Watanabe, Ichihara (JP)

(73) Assignee: Showa Denko K.K., Tokyo (JP)

( * ) Notice: Subject to any disclaimer, the term of this patent is extended or adjusted under 35 U.S.C. 154(b) by 1075 days.

(21) Appl. No.: 11/658,352

(22) PCT Filed: Jul. 28, 2005

(86) PCT No.: PCT/JP2005/014265
§ 371 (c)(1),
(2), (4) Date: Jan. 24, 2007

(87) PCT Pub. No.: WO2006/011672
PCT Pub. Date: Feb. 2, 2006

(65) Prior Publication Data
US 2009/0184329 A1    Jul. 23, 2009

Related U.S. Application Data

(60) Provisional application No. 60/599,571, filed on Aug. 9, 2004.

(30) Foreign Application Priority Data

Jul. 29, 2004 (JP) .................. 2004-222336

(51) Int. Cl.
*H01L 27/15* (2006.01)
*H01L 29/24* (2006.01)

(52) U.S. Cl. .............................. 257/79; 257/98; 257/103
(58) Field of Classification Search ................. 257/79, 257/98, 103, E29.143, E33.064
See application file for complete search history.

(56) References Cited

U.S. PATENT DOCUMENTS

| 5,563,422 A | 10/1996 | Nakamura et al. |
| 6,740,906 B2 | 5/2004 | Slater, Jr. et al. |
| 6,794,685 B2 * | 9/2004 | Hata et al. ............... 257/79 |
| 2001/0015442 A1 | 8/2001 | Kondoh et al. |
| 2001/0042860 A1 | 11/2001 | Hata et al. |
| 2002/0014630 A1 | 2/2002 | Okazaki et al. |
| 2004/0222434 A1 | 11/2004 | Uemura et al. |

FOREIGN PATENT DOCUMENTS

| CN | 1330416 A | 1/2002 |
| CN | 1354528 A | 6/2002 |
| JP | 3068914 U | 7/1991 |
| JP | 07094782 A | 4/1995 |
| JP | 8-102550 A | 4/1996 |
| JP | 8102550 | * 4/1996 |
| JP | 08102550 A | * 4/1996 |
| JP | 10-321913 A | 12/1998 |
| JP | 11186598 A | 7/1999 |
| JP | 11214748 A | 8/1999 |

(Continued)

*Primary Examiner* — Hung Vu
(74) *Attorney, Agent, or Firm* — Sughrue Mion, PLLC

(57) ABSTRACT

An object of the present invention is to provide a transparent positive electrode for use in a face-up-type chip which can emit intense light even using a low drive voltage.
The inventive positive electrode for a semiconductor light-emitting device comprises a transparent electrode formed on a semiconductor layer and a bonding pad electrode formed on the transparent electrode, wherein the bonding pad electrode has a reflecting layer that is in contact with at least the transparent electrode.

30 Claims, 3 Drawing Sheets

FOREIGN PATENT DOCUMENTS

| | | | |
|---|---|---|---|
| JP | 2000036619 A | 2/2000 | |
| JP | 2001-217456 A | 8/2001 | |
| JP | 2001-308380 A | 11/2001 | |
| JP | 2002026392 A | 1/2002 | |
| JP | 2002353506 A | 12/2002 | |
| JP | 2003-163375 A | 6/2003 | |
| JP | 2003163375 | * | 6/2003 |
| JP | 2003163375 A | * | 6/2003 |
| JP | 2004193270 A | 7/2004 | |
| JP | 2004-349301 A | 12/2004 | |
| JP | 2005-191326 A | 7/2005 | |
| KR | 2002-0077703 | 10/2002 | |
| WO | 03/088320 A2 | 10/2003 | |

* cited by examiner

POSITIVE ELECTRODE FOR SEMICONDUCTOR LIGHT-EMITTING DEVICE

CROSS REFERENCE TO RELATED APPLICATION

This application is an application filed under 35 U.S.C. §111(a) claiming benefit, pursuant to 35 U.S.C. §119(e)(1), of the filing date of Provisional Application No. 60/599,571 filed on Aug. 9, 2004, pursuant to 35 U.S.C. §111(b).

TECHNICAL FIELD

The present invention relates to a positive electrode for a semiconductor light-emitting device and, more particularly, to a transparent positive electrode which is suitable for a gallium-nitride-based compound semiconductor light-emitting device which can emit intense light at a low drive voltage.

BACKGROUND ART

In recent years, a GaN-based compound semiconductor material has become of interest as a semiconductor material for use in short-wavelength light-emitting devices. Such a GaN-based compound semiconductor is formed on a substrate (e.g., an oxide single crystal such as a sapphire single crystal, or a Group III-V compound single crystal) through a technique such as metal-organic chemical vapor deposition (MOCVD) or molecular beam epitaxy (MBE).

One characteristic feature of such GaN-based compound semiconductor materials is that the diffusion of current is small in a direction parallel to the light-emitting surface. Such poor current diffusion may be attributable to the presence of a large number of threading dislocations which exists through an epitaxial crystal from the bottom surface (substrate side) to the top surface. However, the reason has not yet been elucidated in detail. Meanwhile, a p-type GaN-based compound semiconductor has a resistivity higher than that of an n-type GaN-based compound semiconductor. Therefore, when a metal layer is stacked on a surface of a p-type GaN-based compound semiconductor layer, substantially no current diffusion occurs in the direction parallel to the p-type layer. Thus, when an LED structure is fabricated from a pn junction of such semiconductors, light emission is limited to only a portion under the positive electrode.

In order to overcome the above-mentioned drawback, a transparent positive electrode through which light emitted from a portion under the positive electrode is extracted is generally used. Specifically, in one proposed technique employed for commercial transparent products, a plurality of Ni layers and Au layers each having a thickness of some tens of nm are stacked on a p-type layer to form a stacked layer, and the layer is heated in an oxygen-containing atmosphere for alloying, thereby promoting reduction in resistance of the p-type layer and simultaneously forming a positive electrode having good transparency and Ohmic characteristics (see Japanese Patent No. 2803742).

The transparent electrode is produced from a material such as a conductive metal oxide or ultra-thin metal film. Direct bonding is difficult to perform with such a material or structure. Therefore, in general, a bonding pad electrode having a sufficient thickness is placed so that electric contact is established between the pad electrode and the transparent electrode. However, because of its relatively large thickness, the metal pad electrode does not exhibit transparency, and the light emitted from a portion under the pad electrode cannot be extracted to the outside, which constitutes a problem.

In a prior art structure to enhance adhesion of a pad electrode, a transparent electrode is partially cut, and a pad electrode is provided so as to bridge neighboring transparent electrodes, whereby bonding strength is enhanced by a portion in direct contact with a GaN semiconductor layer, and current diffusion is caused to occur in a portion being in contact with the transparent electrode (see Japanese Patent Application Laid-Open (kokai) No. 7-94782).

As described above, as the light emitted from a portion under the pad electrode cannot be extracted to the outside, there have been developed techniques for effectively utilizing current in which light emission is avoided in a portion under a pad electrode through inhibition of current injection into the portion.

Specifically, there have been disclosed some techniques for effectively attaining light emission in which injection of current into a portion under a pad is inhibited through provision of an insulating area under the pad electrode (see Japanese Patent Application Laid-Open (kokai) No. 8-250768 and No. 8-250769). There has also been disclosed a technique for inhibiting injection of current into a portion under a pad electrode in which the bottom-most layer of the pad electrode is formed from a metal having high specific contact resistance with respect to the p-type layer (see Japanese Patent Application Laid-Open (kokai) No. 10-242516).

However, studies carried out by the present inventors have revealed that employment of any of the above techniques reduces the ohmic-contact area of the positive electrode with respect to the p-type layer, thereby problematically elevating the drive voltage.

DISCLOSURE OF INVENTION

The present invention was made to solve the aforementioned problems, and an object of the present invention is to provide a transparent positive electrode for use in a face-up-type chip which can emit intense light even using a low drive voltage. As used herein, the term "transparency" refers to transparency to light having a wavelength falling within an emission wavelength range. In the case of a gallium-nitride-based light-emitting device, the emission wavelength range is generally 300 to 600 nm.

The present invention provides the following.

(1) A positive electrode for a semiconductor light-emitting device, the electrode comprising a transparent electrode formed on a semiconductor layer, and a bonding pad electrode formed on the transparent electrode, wherein the bonding pad electrode has a reflecting layer that is in contact with at least the transparent electrode.

(2) A positive electrode for a semiconductor light-emitting device according to (1) above, wherein the adhesion strength between the reflecting layer and the transparent electrode is not less than 490 mN (50 gf) as a peel strength.

(3) A positive electrode for a semiconductor light-emitting device according to (1) or (2) above, wherein the transparent electrode has a transmissibility of 60% to light having a wavelength falling within an emission wavelength range of the semiconductor light-emitting device.

(4) A positive electrode for a semiconductor light-emitting device according to any one of (1) to (3) above, wherein the reflecting layer is composed of a metal selected from the group consisting of Al, Ag, Pt-group metals, and alloys containing at least one metal of Al, Ag, and Pt-group metals.

(5) A positive electrode for a semiconductor light-emitting device according to any one of (1) to (4) above, wherein the semiconductor light-emitting device is a gallium-nitride-based compound semiconductor light-emitting device.

(6) A positive electrode for a semiconductor light-emitting device according to any one of (1) to (5) above, wherein the reflecting layer is composed of a metal selected from the group consisting of Al, Ag, Pt, and alloys containing at least one metal of Al, Ag, and Pt.

(7) A positive electrode for a semiconductor light-emitting device according to any one of (1) to (6) above, wherein the reflecting layer has a thickness of 20 to 3,000 nm.

(8) A positive electrode for a semiconductor light-emitting device according to any one of (1) to (7) above, wherein the bonding pad electrode has a layer structure and includes, in addition to the reflecting layer, a barrier layer composed of Ti, Cr, or Al, and/or an uppermost layer composed of Au or Al.

(9) A positive electrode for a semiconductor light-emitting device according to any one of (1) to (8) above, wherein the transparent electrode includes, on the bonding pad electrode side, a layer composed of a metal.

(10) A positive electrode for a semiconductor light-emitting device according to any one of (1) to (8) above, wherein the transparent electrode includes, on the bonding pad electrode side, a layer composed of a transparent material.

(11) A positive electrode for a semiconductor light-emitting device according to (10) above, wherein the transparent electrode consists of only a conductive transparent material other than a metal.

(12) A positive electrode for a semiconductor light-emitting device according to any one of (1) to (11) above, wherein a process to extract emission light is performed on an uppermost surface of the transparent electrode.

(13) A positive electrode for a semiconductor light-emitting device according to (12) above, wherein the uppermost surface of the transparent electrode is formed of a transparent material.

(14) A positive electrode for a semiconductor light-emitting device according to any one of (1) to (13) above, wherein the transparent electrode has a contact layer that is in contact with a p-type semiconductor layer, and a current diffusion layer that is provided on the contact layer.

(15) A positive electrode for a semiconductor light-emitting device according to (14) above, wherein the contact layer is composed of a platinum-group metal or an alloy thereof.

(16) A positive electrode for a semiconductor light-emitting device according to (15) above, wherein the contact layer is composed of platinum.

(17) A positive electrode for a semiconductor light-emitting device according to any one of (14) to (16) above, wherein the contact layer has a thickness of 0.1 to 7.5 nm.

(18) A positive electrode for a semiconductor light-emitting device according to (17) above, wherein the contact layer has a thickness of 0.5 to 2.5 nm.

(19) A positive electrode for a semiconductor light-emitting device according to any one of (14) to (18) above, wherein the current diffusion layer is composed of a metal selected from the group consisting of gold, silver, and copper, or of an alloy containing at least one metal of gold, silver, and copper.

(20) A positive electrode for a semiconductor light-emitting device according to (19) above, wherein the current diffusion layer is composed of gold or a gold alloy.

(21) A positive electrode for a semiconductor light-emitting device according to any one of (14) to (20) above, wherein the current diffusion layer has a thickness of 1 to 20 nm.

(22) A positive electrode for a semiconductor light-emitting device according to (21) above, wherein the current diffusion layer has a thickness of 3 to 6 nm.

(23) A positive electrode for a semiconductor light-emitting device according to any one of (14) to (18) above, wherein the current diffusion layer is composed of a conductive transparent material.

(24) A positive electrode for a semiconductor light-emitting device according to any one of (10), (11), (13) and (23), wherein the transparent material is at least one substance selected from the group consisting of ITO, zinc oxide, zinc aluminum oxide, F-doped tin oxide, titanium oxide, zinc sulfide, bismuth oxide and magnesium oxide.

(25) A positive electrode for a semiconductor light-emitting device according to (24) above, wherein the transparent material is at least one substance selected from the group consisting of ITO, zinc oxide, zinc aluminum oxide and F-doped tin oxide.

(26) A positive electrode for a semiconductor light-emitting device according to any one of (10), (11), (13) and (23) to (25), wherein the transparent material has a thickness of 10 to 5,000 nm.

(27) A positive electrode for a semiconductor light-emitting device according to (26) above, wherein the transparent material has a thickness of 100 to 1,000 nm.

(28) A semiconductor light-emitting device employing a positive electrode according to any one of (1) to (27) above.

(29) A gallium-nitride-based compound semiconductor light-emitting device comprising a substrate; an n-type semiconductor layer, a light-emitting layer, and a p-type semiconductor layer, the layers being stacked on the substrate in this order and formed of a gallium-nitride-based compound semiconductor layer; a positive electrode provided on the p-type semiconductor layer; and a negative electrode provided on the n-type semiconductor layer, wherein the positive electrode is a positive electrode according to any one of (1) to (27) above.

(30) A lamp employing a light-emitting device according to (28) or (29) above.

According to the present invention, the bonding pad electrode, which allows current to flow to the transparent electrode, is provided with a reflecting layer that is in contact with at least the transparent electrode, whereby attenuation of emitted light due to light absorption at the interface between the bonding pad electrode and the transparent electrode can be reduced. Thus, extraction efficiency, and the intensity of the emitted light can be enhanced.

BEST MODES FOR CARRYING OUT THE INVENTION

Figure 1:
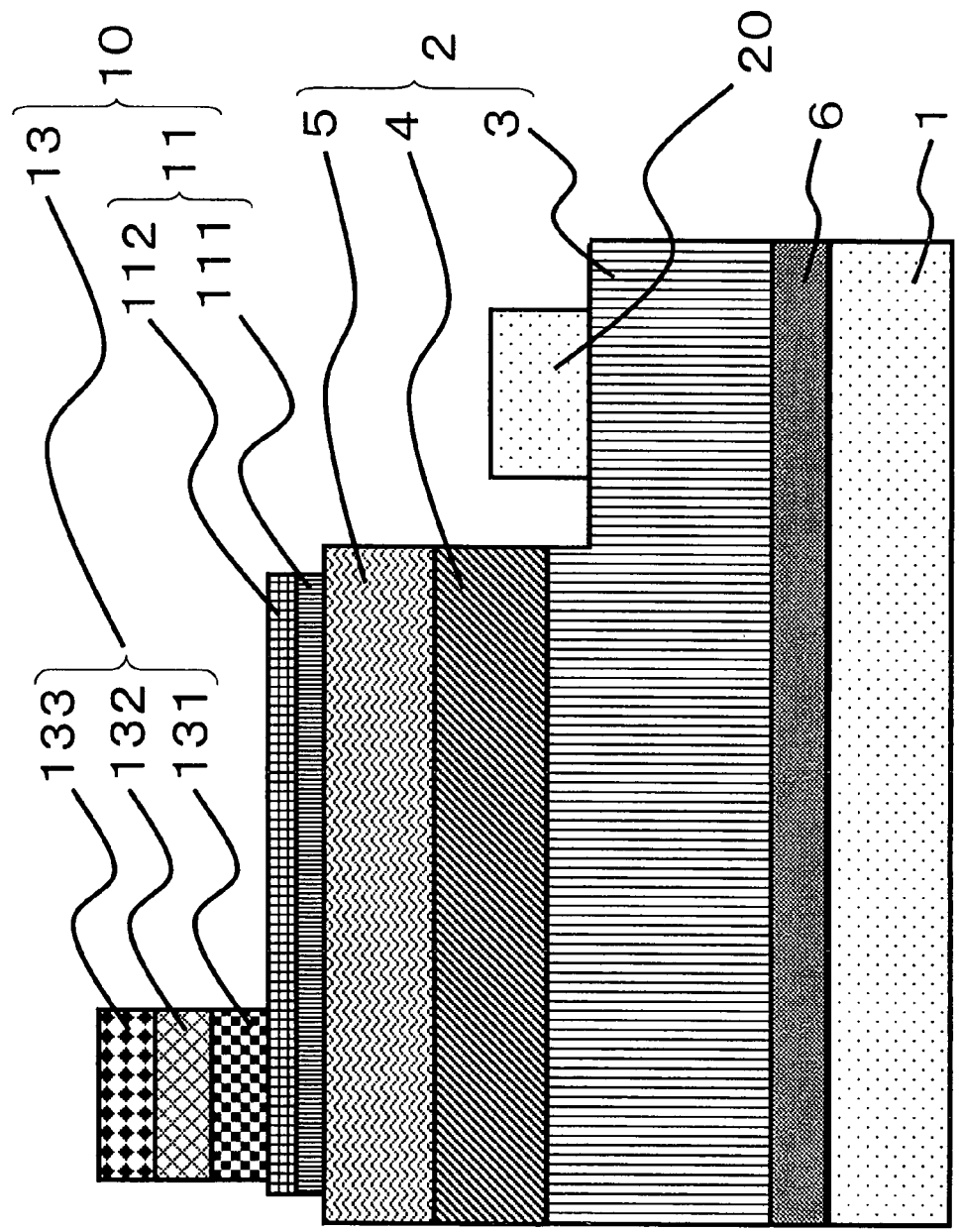
FIG. 1 is a schematic cross-section of a light-emitting device employing the positive electrode of the present invention.

FIG. 1 is a schematic cross-section of a light-emitting device employing the positive electrode of the present invention. Reference numeral 10 denotes the positive electrode of the present invention, which is composed of a transparent electrode (11) and a bonding pad electrode (13). The transparent electrode (11) is composed of, for example, a contact layer (111) and a current diffusion layer (112). The bonding pad electrode (13) is composed of, for example, a reflecting layer (131), a barrier layer (132), and an uppermost layer (133); i.e., has a three-layer structure. Reference numeral 1 denotes a substrate, 2 denotes a GaN-based compound semiconductor layer, which is constituted of an n-type semiconductor layer (3), a light-emitting layer (4) and a p-type semiconductor layer (5), 6 denotes a buffer layer, and 20 denotes a negative electrode.

In a face-up-type chip having a transparent positive electrode, the light emitted from the light-emitting layer (4) is exclusively extracted through a side face of the chip and through the transparent electrode not covered with the bonding pad electrode.

Through employment of the positive electrode of the present invention, the light emitted toward the bonding pad electrode (13) is reflected by the reflecting layer (131) serving as the bottom surface of the bonding pad electrode (i.e., the surface in contact with the transparent electrode). Some reflected rays are scattered in the transverse direction or an oblique direction, and other rays are reflected to a portion under the bonding pad electrode. The rays scattered in the transverse direction or an oblique direction are extracted to the outside through a side face of the chip, while the rays reflected to a portion under the bonding pad electrode are further scattered or reflected by the bottom surface of the chip, and extracted through a side face of the chip and through a portion of the transparent electrode (not covered with the bonding pad electrode).

The thus-provided reflecting layer serving as a bottommost layer of the bonding pad electrode allows the light emitted under the bonding pad electrode to be extracted to the outside, thereby attaining high emission intensity. In contrast, when the bottommost layer of the bonding pad electrode absorbs light, the light emitted under the pad electrode is virtually absorbed by the bottommost layer of the pad electrode, and is not extracted to the outside.

In order to certainly attain the effect of the present invention, it is necessary that the reflecting layer is in direct contact with the transparent electrode. As the result, it is necessary that the reflecting layer adheres to the transparent electrode strongly so that the bonding pad electrode has a sufficient strength. The bonding pad electrode must not peel off from the transparent electrode in a step of connecting a gold wire to the bonding pad electrode in a conventional method. Thus, it is preferable that an adhesion strength of the reflecting layer and the transparent electrode is not less than 490 mN (50 gf) as a peel strength. A peel strength not less than 784 mN (80 gf) is more preferable and a peel strength not less than 980 mN (100 gf) is most preferable. In order to enhance the adhesion strength of the reflecting layer and the transparent electrode, for example, there are methods in which the surface of the transparent electrode is pretreated or a heat treatment is performed after a formation of the reflecting layer.

Reflectance of the reflecting layer, which varies depending on the material forming the reflecting layer, is preferably 60% or higher, more preferably 80% or higher, still more preferably 90% or higher.

The reflectance may be readily determined by use of an apparatus such as a spectrophotometer. However, reflectance of the bonding pad electrode is difficult to determine because the electrode per se has a very small surface area. Thus, in one alternative method, a wide, transparent dummy substrate made of, for example, glass, is provided in a chamber during formation of the bonding pad electrode, and the same bonding pad electrode is formed on the dummy substrate. The reflectance of the bonding pad electrode on the dummy substrate is determined.

The reflecting layer of the bonding pad electrode is preferably formed from a metal having high reflectance. Specifically, the reflecting layer is preferably formed from a platinum-group metal such as Pt, Rh, Ru, or Ir; Al; Ag; or an alloy containing at least one metal element selected from these metals. Among these metals, Al, Ag, Pt, and an alloy containing at least one metal element selected from these metals are generally employed as electrode materials and, thus, are preferred from the viewpoint of availability, ease of handling, etc.

The bonding pad electrode is directly formed on the transparent electrode without forming an opening or a window therein. When the bonding pad electrode is provided on the transparent electrode, the ohmic-contact area is not reduced, and contact resistance of the electrode is not raised in a portion even under the bonding pad electrode. Thus, an increase in a drive voltage can be prevented. In addition, as the light that has passed through the transparent electrode is reflected by the reflecting layer serving as the bottommost surface of the bonding pad electrode, excessive light absorption can be suppressed.

The bonding pad electrode may be formed at any place on the transparent electrode. For example, the bonding pad electrode may be formed at the place farthest from the negative electrode or at the center of the chip. However, a bonding pad electrode formed at a place excessively close to the negative electrode is not preferred, as a short circuit may occur between wires or balls during bonding.

The bonding pad electrode preferably has as large a surface area as possible for facilitating the bonding operation. However, as the surface area becomes larger, extraction of emitted light is inhibited. As a result, output of the chip drops considerably. For example, when more than half the chip surface area is covered with the pad electrode, extraction of emitted light is inhibited, resulting in a considerable drop in output, whereas when the surface area of the pad electrode is excessively small, bonding operation becomes difficult, resulting in reduction of product yield. Thus, preferably, the surface area of the pad electrode is slightly larger than the diameter of a bonding ball. Generally, the pad electrode has a plan view of a circle having a diameter of about 100 µm.

In the case where the reflecting layer of the bonding pad electrode is formed from high-reflectance metal, the thickness of the reflecting layer is preferably 20 to 3,000 nm. When the reflecting layer is excessively thin, sufficient reflection cannot be attained, whereas when the thickness is excessively large, the period required for forming the reflecting layer is prolonged, and material cost increases; i.e., no merit is provided. More preferably, the thickness is 50 to 1,000 nm, with 100 to 500 nm being most preferred.

The bonding pad electrode may be formed exclusively from the aforementioned high-reflectance metal. In other words, the bonding pad electrode may be composed of a reflecting layer only. Meanwhile, bonding pad electrodes of a variety of materials and structures have already been known. Thus, the aforementioned reflecting layer may be provided on the semiconductor layer side (i.e., on the transparent electrode side) of any of the known bonding pad electrodes. Alternatively, the bottommost layer (on the semiconductor layer side) of any of the known bonding pad electrodes may be substituted by the aforementioned reflecting layer.

In the case of such a stacked structure of the bonding pad electrode, no particular limitation is imposed on the stacking portion on the reflecting layer, and any configuration of the staking portion may be employed. In a stacked-structure bonding pad electrode, a layer provided on the reflecting layer plays a role in enhancing the strength of the entirety of the bonding pad electrode. Thus, such a layer must be formed from a metallic material having relatively high strength or must be sufficiently thick. From this viewpoint, Ti, Cr, and Al are desirable material. Among them, Ti is preferred from the viewpoint of material strength. In the case where the layer strengthens the bonding pad electrode, the layer is called a "barrier layer."

The reflecting layer may also serve as a barrier layer. When the reflecting layer is formed from a metallic material having high reflectance and high strength and has a large thickness, no additional barrier layer is needed to form. For example, when the reflecting layer is formed from Al, no barrier layer is needed.

The barrier layer preferably has a thickness of 20 to 3,000 nm. When the barrier layer is excessively thin, the effect of enhancing the strength is insufficient, whereas when the layer is excessively thick, no particular merit is obtained, and only an increase in cost occurs. More preferably, the thickness is 50 to 1,000 nm, most preferably 100 to 500 nm.

The uppermost layer (on the side opposite the reflecting layer) of the bonding pad electrode is preferably formed from a material which is firmly bonded to bonding balls. Bonding balls are generally composed of gold, and Au and Al are known to have excellent bonding performance to gold bonding balls. Among them, gold is particularly preferred. The uppermost layer preferably has a thickness of 50 to 1,000 nm, more preferably 100 to 500 nm. When the uppermost layer is excessively thin, bonding performance to bonding balls is insufficient, whereas when the layer is excessively thick, no particular merit is obtained, merely increasing cost.

The transparent electrode formed on a p-type semiconductor layer satisfies requirements in performance. Examples of preferred performance include low contact resistance with the p-type layer, excellent optical transmittance (in the case where the light-emitting device is a face-up-mount type in which light emitted from the light-emitting layer is extracted through the electrode side), and excellent electrical conductivity for uniformly diffusing current over the p-type layer.

Transparent electrodes of a variety of materials and structures have been already known, and any of the known transparent electrodes may be employed in the present invention without any limitation. However, in order to satisfy the aforementioned requirements in performance, the transparent electrode preferably has a structure containing at least two layers; i.e., a contact layer that is in contact with the p-type layer and a current diffusion layer which is provided on the contact layer and which facilitates current diffusion. If the aforementioned requirements in performance are satisfied, of course, one layer which has performances of both the contact layer and the current diffusion layer may be employed. When one layer structure is employed, it is an advantage that there is less complexity in a manufacturing process.

The contact layer is required to exhibit a low contact resistance to the p-type layer. From this viewpoint, the contact layer is preferably formed from a platinum-group metal such as platinum (Pt), ruthenium (Ru), osmium (Os), rhodium (Rh), iridium (Ir), or palladium (Pd), or from an alloy thereof. Among them, Pt and a Pt alloy are particularly preferred, since they have high work function and can realize an excellent ohmic contact, without any heat treatment, with respect to a p-type GaN-based compound semiconductor layer having relatively high resistance which has not undergone high-temperature heat treatment.

In the case in which the contact layer is formed from a platinum-group metal or an alloy thereof, the thickness of the layer must be considerably reduced from the viewpoint of optical transparency, and is preferably 0.1 to 7.5 nm. When the thickness is less than 0.1 nm, such thin film cannot be reliably formed, whereas when the thickness is in excess of 7.5 nm, transparency decreases. More preferably, the thickness is 5 nm or less. In consideration of drop in transparency due to subsequent stacking of a current diffusion layer and stability of formed film, the thickness is particularly preferably 0.5 to 2.5 nm.

However, when the thickness of the contact layer is reduced, electrical resistance of the contact layer in the plane direction increases, and current diffusion is limited to a periphery of the bonding pad electrode serving as a current injection portion due to a comparatively high resistance of a p-type layer. As a result, uniformity in emission pattern decreases, thereby lowering emission output.

When a current diffusion layer having high light transmittance and high electrical conductivity, serving as means for promoting current diffusion performance of the contact layer, is disposed on the contact layer, uniform diffusion of current can be realized without greatly impairing low contact resistance and light transmittance of the platinum-group metal, whereby a light-emitting device with a high output can be produced.

The current diffusion layer is preferably formed from a metallic material having high conductance, for example, a metal selected from the group consisting of gold, silver, and copper; or an alloy containing at least one of these metals. Among them, gold is most preferred, as a thin film thereof exhibits high light transmittance.

Alternatively, the current diffusion layer may also be formed from a transparent material having high conductance such as a zinc sulfide and a metal oxide, for example, ITO, zinc oxide, zinc aluminum oxide, F-doped tin oxide, titanium oxide, bismuth oxide and magnesium oxide. Such a transparent material is preferred from the viewpoint of high light transmittance. Among them, ITO, zinc oxide, zinc aluminum oxide and F-doped tin oxide are known to have conductivity, and thus are most preferred.

In the case where the current diffusion layer is formed from a metal, the thickness of the layer is preferably 1 to 20 nm. When the thickness is less than 1 nm, current diffusion effect is poor, whereas when the thickness is in excess of 20 nm, optical transparency of the current diffusion layer is considerably lowered, possibly reducing emission output. More preferably, the thickness is 10 nm or less. Further, when the thickness is controlled to 3 to 6 nm, the current diffusion layer has balanced optical transparency and current diffusion effects. Through a combination of such a current diffusion layer and the aforementioned contact layer, uniform emission can be attained over the entire surface of the positive electrode with high emission output.

In the case where the current diffusion layer is formed from a transparent material, the thickness of the layer is preferably 10 to 5,000 nm. When the thickness is less than 10 nm, current diffusion effect is poor, whereas when the thickness is in excess of 5,000 nm, optical transparency of the current diffusion layer is considerably lowered, possibly reducing emission output. More preferably, the thickness is 50 to 2,000 nm. Further, when the thickness is controlled to 100 to 1,000 nm, the current diffusion layer has balanced optical transparency and current diffusion effects. Through combination of such a current diffusion layer and the aforementioned contact layer, uniform emission can be attained over the entire surface of the positive electrode with a high output.

In the case where a bonding pad electrode is formed on the transparent electrode, the uppermost layer of the transparent electrode may be coated with a metal or a metal oxide.

The uppermost layer of the transparent electrode may be a current diffusion layer, and the current diffusion layer may be covered with a layer for joining a bonding pad electrode. As formation of the layer for joining impairs the transparency, the uppermost layer is preferably a current diffusion layer.

A process to extract an emission light may be performed on an uppermost surface of the transparent electrode. In such a process, for example, recessed portions and/or convex portions are provided on the uppermost surface of the transparent electrode. Recessed portions and/or convex portions may be provided by using patterning, or by a wet treatment. No particular limitation is imposed on a shape of recessed portions and/or convex portions, and any known shape such as a stripe, a lattice and a dot may be employed.

Also, when a bonding pad electrode is formed on such a surface having recessed portions and/or convex portions, an adhesion strength of the reflecting layer and the transparent electrode may be enhanced.

No particular limitation is imposed on the method of forming the contact layer, the current diffusion layer and the bonding pad electrode, and any known method such as vacuum vapor deposition or sputtering may be employed.

The positive electrode of the present invention may be applicable to any of conventionally known semiconductor light-emitting devices including a gallium-nitride-based compound semiconductor light-emitting device, for example, a device as shown in FIG. 1 including a substrate; a gallium-nitride-based compound semiconductor layers (i.e., an n-type semiconductor layer, a light-emitting layer, and a p-type semiconductor layer) stacked on the substrate by the mediation of the buffer layer.

No particular limitation is imposed on the material of the substrate, and the substrate may be formed of any known material. Examples of the known material include oxide single crystals such as sapphire single crystal ($Al_2O_3$; A-plane, C-plane, M-plane, or R-plane), spinel single crystal ($MgAl_2O_4$), ZnO single crystal, $LiAlO_2$ single crystal, $LiGaO_2$ single crystal, and MgO single crystal; Si single crystal; SiC single crystal; GaAs single crystal; AlN single crystal; GaN single crystal; and boride single crystals such as $ZrB_2$ single crystal. No particular limitation is imposed on the crystal orientation of the substrate. The crystal plane of the substrate may be inclined to a specific crystal plane or not inclined.

No particular limitation is imposed on the structure of the n-type semiconductor layer, the light-emitting layer, and the p-type semiconductor layer, and these layer may have a variety of known structures. The p-type semiconductor layer may have a conventional carrier concentration. Notably, the transparent electrode of the present invention may also be applicable to a p-type semiconductor layer having a low carrier concentration (e.g., about $1 \times 10^{17}$ $cm^{-3}$).

In the present invention, no particular limitation is imposed on the type of the gallium-nitride-based compound semiconductor for forming the n-type semiconductor layer, the light-emitting layer, and the p-type semiconductor layer, and conventionally known semiconductors represented by formula: $Al_xIn_yGa_{1-x-y}N$ ($0 \leq x < 1$, $0 \leq y < 1$, $0 \leq x+y < 1$) may be employed.

No particular limitation is imposed on the method for growing these gallium nitride semiconductors, and there may be employed any known method for growing a Group III nitride semiconductor, such as MOCVD (metal-organic chemical vapor deposition), HVPE (hydride vapor phase epitaxy), or MBE (molecular beam epitaxy). From the viewpoints of layer thickness controllability and mass productivity, MOCVD is preferably employed. In the case of MOCVD, hydrogen ($H_2$) or nitrogen ($N_2$) is employed as a carrier gas, trimethylgallium (TMG) or triethylgallium (TEG) is employed as a Ga (Group III element) source, trimethylaluminum (TMA) or triethylaluminum (TEA) is employed as an Al (Group III element) source, trimethylindium (TMI) or triethylindium (TEI) is employed as an In (Group III element) source, and ammonia ($NH_3$), hydrazine ($N_2H_4$), or the like is employed as an N (Group V element) source. In addition, monosilane ($SiH_4$) or disilane ($Si_2H_6$) serving as an Si source, or germane ($GeH_4$) or an organic germanium compound serving as a Ge source is employed as an n-type dopant, whereas bis(cyclopentadienyl)magnesium ($Cp_2Mg$) or bis(ethylcyclopentadienyl)magnesium (($EtCp)_2Mg$) serving as an Mg source is employed as a p-type dopant.

In order to attach a negative electrode to a gallium-nitride-based compound semiconductor structure including a substrate and an n-type semiconductor layer, a light-emitting layer, and a p-type semiconductor layer, the layers being successively provided atop the substrate, such that the negative electrode is in contact with the n-type semiconductor layer, a portion of the light-emitting layer and a portion of the p-type semiconductor layer are removed so as to expose the n-type semiconductor layer. Thereafter, the positive electrode of the present invention is formed on the remaining p-type semiconductor layer, and a negative electrode is formed on the exposed n-type semiconductor layer. No particular limitation is imposed on the composition and structure of the negative electrode, and any known negative electrode may be employed.

When a substrate transparent to light having a wavelength falling within an emission wavelength range such as sapphire and SiC is employed, a reflecting film may be provided on a back of the substrate. When the reflecting film is provided, a loss of an emission light at the bottom of the substrate can be reduced. Thus, an extraction efficiency of the emitted light can be further enhanced.

Also, a process by which recessed portions and/or convex portions are provided on a surface of a semiconductor or a transparent electrode, or the back of a substrate may be performed. As the result, an extraction efficiency of the emitted light can be further enhanced. Inclined surfaces as well as vertical surfaces to the substrate may be formed by the process. In order to prevent multiple reflections, inclined surfaces are preferably formed. The process may be performed by grinding a surface of a semiconductor or a transparent electrode, or a back of a substrate. Alternatively, the process may be performed by applying a structure of a transparent material.

Through employment of the positive electrode of the present invention for a semiconductor light-emitting device, a gallium-nitride-based compound semiconductor light-emitting device exhibiting high emission intensity can be produced. In other words, a high-luminance LED can be produced on the basis of the technique. Thus, electronic devices such as mobile phones and display panels, each employing a chip fabricated on the basis of the technique; and machines and apparatuses such as automobiles, computers, and game machines, each employing any of the electronic device can be driven at low electric power and realize excellent characteristics. Particularly, an electric power saving effect is remarkably attained in mobile phones, game machines, toys and automotive parts which are driven by a battery.

EXAMPLES

The present invention will next be described in more detail by way of examples, which should not be construed as limiting the invention thereto.

Example 1

Figure 2:
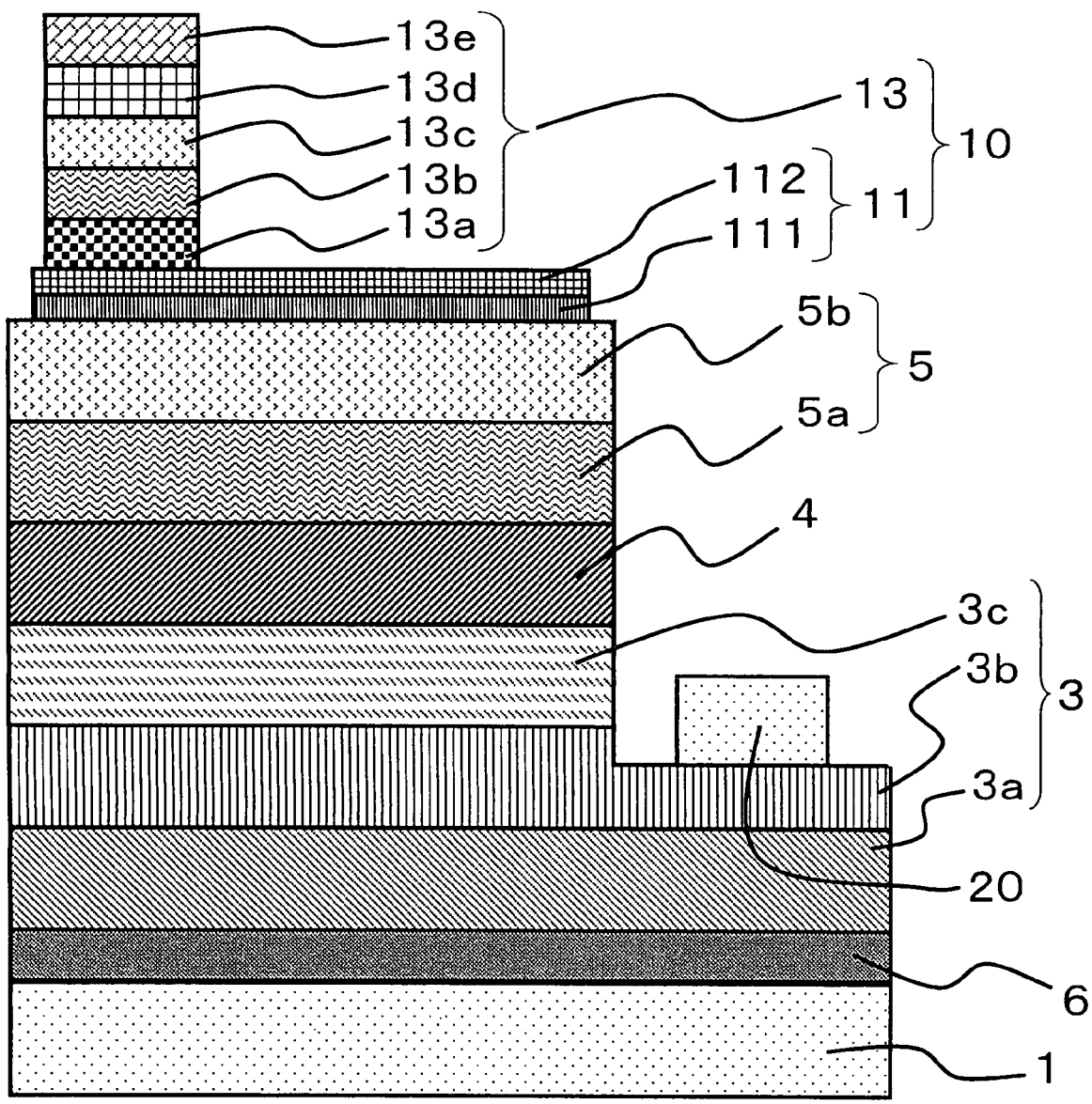
FIG. 2 is a schematic cross-section of the gallium-nitride-based compound semiconductor light-emitting device employing the positive electrode of the present invention and fabricated in Examples.
Figure 3:
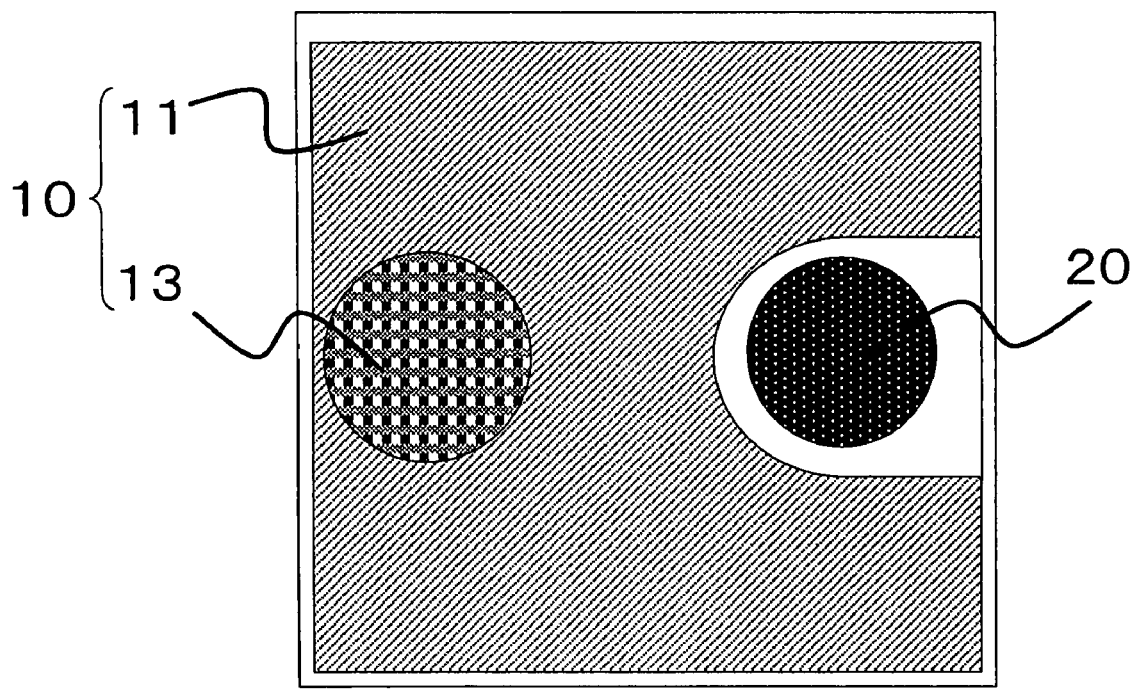
FIG. 3 is a schematic plan view of the gallium-nitride-based compound semiconductor light-emitting device employing the positive electrode of the present invention and fabricated in Examples.

FIG. 2 shows a cross-section of the gallium-nitride-based compound semiconductor light-emitting device fabricated in this Example, and FIG. 3 shows a plan view thereof. A gallium nitride compound semiconductor stacked structure was fabricated through the following procedure. An AlN buffer layer (6) was formed on a sapphire substrate (1), and on the buffer layer, the following layers were sequentially formed: an undoped GaN undercoat layer (thickness: 8 μm) (3a); an Si-doped n-type GaN contact layer (thickness: 2 μm) (3b); an n-type $In_{0.1}Ga_{0.9}N$ cladding layer (thickness: 250 nm) (3c); a light-emitting layer (4) of a multiple quantum well structure including Si-doped GaN barrier layers (5 layers and one final layer, each thickness: 16 nm) and $In_{0.2}Ga_{0.8}N$ well layers (5 layers, each thickness: 2.5 nm); an Mg-doped p-type $Al_{0.07}Ga_{0.93}N$ cladding layer (thickness: 0.01 μm) (5a); and an Mg-doped p-type GaN contact layer (thickness: 0.15 μm) (5b). On the p-type GaN contact layer of the gallium-nitride-based compound semiconductor stacked structure, the positive electrode (10) of the present invention was formed, the positive electrode being composed of a transparent electrode (11) including a Pt contact layer (thickness: 1.5 nm) (111) and an Au current diffusion layer (thickness: 5 nm) (112); and a bonding pad electrode (13) having a five-layer structure consisting of a Pt layer (thickness: 50 nm) (13a), a Ti layer (thickness: 20 nm) (13b), an Al layer (thickness: 10 nm) (13c), a Ti layer (thickness: 100 nm) (13d), and an Au layer (thickness: 200 nm) (13e). Among five layers forming the bonding pad electrode, the Pt layer (thickness: 50 nm) (13a) having high reflectance served as a reflecting layer. On the n-type GaN contact layer, a negative electrode (20) having a Ti/Au double-layer structure was formed. The semiconductor side of the thus-fabricated light-emitting device serves as a light-extraction side. FIG. 3 shows the structures of the positive electrode and the negative electrode.

In the above stacked structure, the n-type GaN contact layer had a carrier concentration of $1 \times 10^{19}$ cm$^{-3}$, the GaN barrier layer had an Si dopant concentration of $1 \times 10^{18}$ cm$^{-3}$, the p-type GaN contact layer had a carrier concentration of $5 \times 10^{18}$ cm$^{-3}$, and the p-type AlGaN cladding layer had an Mg dopant concentration of $5 \times 10^{19}$ cm$^{-3}$.

These gallium nitride compound semiconductor layers were stacked through MOCVD under well-known typical conditions. The positive electrode and the negative electrode were formed through the following procedure.

A portion of the n-type GaN contact layer on which the negative electrode was to be provided was exposed by means of reactive ion etching through the following procedure.

Firstly, an etching mask was formed on the p-type semiconductor layer through the following procedure. A photoresist was applied on the entire surface of the semiconductor stacked structure, and a portion of the resist, which portion was slightly larger than the positive electrode, was removed through a known photolithographic technique. The thus-treated stacked structure was placed in a vacuum vapor deposition apparatus, and Ni (thickness: about 50 nm) and Ti (thickness: about 300 nm) were stacked through the electron-beam method at $4 \times 10^{-4}$ Pa or lower. Subsequently, the stacked metal film along with the resist was removed from the area other than the positive electrode area through lift-off.

On an electrode set in an etching chamber of the reactive ion etching apparatus, the semiconductor stacked structure was placed. The etching chamber was evacuated to $10^{-4}$ Pa, and etching gas (Cl$_2$) was fed to the evacuated chamber. Etching was performed until the n-type GaN contact layer was exposed. After completion of etching, the structure was removed from the reactive ion etching apparatus, and the etching mask was removed with nitric acid and hydrofluoric acid.

Subsequently, through known photolithography and lift-off techniques, a contact layer composed of Pt and a current diffusion layer composed of Au were formed on the p-type GaN contact layer exclusively in an area for forming a positive electrode. In the formation of the contact layer and the current diffusion layer, a gallium-nitride-based compound semiconductor layer stacked structure was placed in a vacuum vapor deposition apparatus, and Pt (1.5 nm) and Au (5 nm) were sequentially stacked on the p-type GaN contact layer. After removal of the stacked structure from the vacuum chamber, the stacked structure was treated with a lift-off procedure which is widely known. In a similar manner, on a portion of the current diffusion layer, a Pt reflecting layer (13a), a Ti barrier layer (13b), an Al barrier layer (13c), a Ti barrier layer (13d), and an Au uppermost layer (13e) were sequentially formed, to thereby form a bonding pad electrode (13). Thus, the positive electrode of the present invention was formed on the p-type GaN contact layer.

On the thus-exposed n-type GaN contact layer, the negative electrode was formed through the following procedure. Firstly, a resist was applied to the entire surface of the structure, and a portion of the resist for forming the negative electrode on the exposed n-type GaN contact layer was removed through a known photolithographic technique. Through conventionally employed vacuum vapor deposition, Ti (100 nm) and Au (200 nm) were sequentially deposited on the semiconductor layer, to thereby form a negative electrode. Thereafter, the resist was removed through a routine method.

The backside of the substrate of the thus-formed wafer having the positive electrode and the negative electrode was ground and polished, to thereby adjust the substrate thickness to 80 μm, followed by scribing the wafer on the semiconductor-stacked layer side, by use of a laser scriber, and cutting through the chip-division lines, to thereby produce square chips (350 μm×350 μm). The forward voltage of the respective chips, at an applied current of 20 mA, was found to be 2.9 V through measurement by means of a probe.

The chip was mounted in a TO-18 package can. The emission output of the chip at an applied current of 20 mA was found to be 4.5 mW through measurement by means of a tester. Distribution of emission from the light-emitting surface indicated that light emission occurred in the entire area of the light-emitting surface corresponding to the positive electrode above the surface.

The reflecting layer fabricated in Example 1 was found to have a reflectance of 92% in a wavelength region of 470 nm. The reflectance was determined by means of a spectrophotometer by use of a glass-made dummy substrate, which had been placed in the same chamber during the formation of the bonding pad electrode.

Also, a peel strength of the bonding pad electrode was determined by a conventional shear tester. The peel strength was found to be not less than 980 mN (100 gf) on the average and there was nothing to peel off from the transparent electrode.

Comparative Example 1

The procedure of Example 1 was repeated, except that no transparent electrode was provided in an area where a bonding pad electrode was formed, and that the bonding pad electrode had no reflecting layer (13a), to thereby fabricate a light-emitting device. Thus, in Comparative Example 1, the bottommost layer (on the semiconductor side) of the bonding pad electrode was a Ti layer (13b), which was in direct contact with a p-type contact layer (5b).

In order to establish electric contact, a periphery of the bonding pad electrode was brought into contact with the transparent electrode, with the contact area being about 5% the area of the bonding pad electrode. Current flowed from the bonding pad electrode to the transparent electrode via the contact portion.

The thus-fabricated light-emitting device was evaluated in a manner similar to that of Example 1, and the forward voltage and the emission output were found to be 3.1 V and 4.2 mW, respectively. Distribution of emission from the light-emitting surface indicated that no light emission occurred in the area corresponding to the bonding pad electrode above the area. The results indicated that Ti had a higher contact resistance with respect to the p-type contact layer (5b) and lower reflectance, as compared with Pt.

Example 2

The procedure of Example 1 was repeated, except that the thickness of the Pt contact layer (111) of the transparent electrode (11) was adjusted to 1 nm; that an ITO film having a thickness of 100 nm formed through sputtering was employed as the current diffusion layer (112); and that the reflecting layer (13a) of the bonding pad electrode was formed from Al, to thereby fabricate a light-emitting device.

The thus-fabricated light-emitting device was evaluated in a manner similar to that of Example 1, and forward voltage and emission output were found to be 2.9 V and 5.0 mW, respectively.

Also, a peel strength of the bonding pad electrode was determined by a conventional shear tester. The peel strength was found to be not less than 980 mN (100 gf) on the average but peeling off occurred at the interface between the bonding pad electrode and the transparent electrode in several samples.

Comparative Example 2

The procedure of Example 1 was repeated, except that the bonding pad electrode had (13) no reflecting layer (13a), to thereby fabricate a light-emitting device. The thus-fabricated light-emitting device was evaluated in a manner similar to that of Example 1. As a result, the forward voltage was found to be 2.9 V, which was a low value similar to Example 2, but the emission output was lowered to 4.7 mW.

Example 3

In this example, a gallium nitride compound semiconductor stacked structure was fabricated through the following procedure in a manner similar to Example 1. An AlN buffer layer (6) was formed on a sapphire substrate (1), and on the buffer layer, the following layers were sequentially formed: an undoped GaN undercoat layer (thickness: 6 μm) (3a); an Ge-doped n-type GaN contact layer (thickness: 4 μm) (3b); an Si-doped n-type $In_{0.1}Ga_{0.9}N$ cladding layer (thickness: 180 nm) (3c); a light-emitting layer (4) of a multiple quantum well structure including Si-doped GaN barrier layers (5 layers and one final layer, each thickness: 16 nm) and $In_{0.2}Ga_{0.8}N$ well layers (5 layers, each thickness: 2.5 nm); an Mg-doped p-type $Al_{0.07}Ga_{0.93}N$ cladding layer (thickness: 0.01 μm) (5a); an Mg-doped p-type $Al_{0.02}Ga_{0.98}N$ contact layer (thickness: 0.175 μm) (5b); and an Ge-doped n-type GaN tunnel layer (thickness: 20 nm) (not illustrated). On the Ge-doped n-type GaN tunnel layer of the gallium-nitride-based compound semiconductor stacked structure, the positive electrode (10) of the present invention was formed, the positive electrode being composed of a transparent electrode (11) consisting of only a ITO current diffusion layer (thickness: 250 nm) (112); and a bonding pad electrode (13) having a five-layer structure consisting of a Al layer (thickness: 50 nm) (13a), a Ti layer (thickness: 20 nm) (13b), an Al layer (thickness: 10 nm) (13c), a Ti layer (thickness: 100 nm) (13d), and an Au layer (thickness: 200 nm) (13e). Among five layers forming the bonding pad electrode, the Al layer (thickness: 50 nm) (13a) having high reflectance served as a reflecting layer. On the n-type GaN contact layer, a negative electrode (20) having a Ti/Au double-layer structure was formed. The semiconductor side of the thus-fabricated light-emitting device serves as a light-extraction side. FIG. 3 shows the structures of the positive electrode and the negative electrode.

In the above stacked structure, the n-type GaN contact layer had a carrier concentration of $8 \times 10^{18}$ $cm^{-3}$, an n-type InGaN cladding layer had an Si dopant concentration of $7 \times 10^{18}$ $cm^{-3}$, the GaN barrier layer had an Si dopant concentration of $1 \times 10^{17}$ $cm^{-3}$, the p-type AlGaN contact layer had a carrier concentration of $5 \times 10^{17}$ $cm^{-3}$, the p-type AlGaN cladding layer had an Mg dopant concentration of $2 \times 10^{20}$ $cm^{-3}$, and the n-type GaN tunnel layer had an Ge dopant concentration of $2 \times 10^{19}$ $cm^{-3}$.

The thus-fabricated light-emitting device was evaluated in a manner similar to that of Example 1, and the forward voltage and the emission output were found to be 3.2 V and 8.5 mW, respectively.

Also, a peel strength of the bonding pad electrode was determined by a conventional shear tester. The peel strength was found to be not less than 980 mN (100 gf) on the average but peeling off occurred at the interface between the bonding pad electrode and the transparent electrode in several samples.

INDUSTRIAL APPLICABILITY

The semiconductor light-emitting device employing the positive electrode of the present invention exhibits low drive voltage and high emission intensity. Thus, the light-emitting device is remarkably useful for producing a lamp or a similar device.

The invention claimed is:

1. A positive electrode for a semiconductor light-emitting device, the electrode comprising a transparent electrode formed on a semiconductor layer, and a bonding pad electrode formed on the transparent electrode, wherein the bonding pad electrode has a reflecting layer that is in contact with at least the transparent electrode, and the reflecting layer has a reflectance of 60% or higher.

2. The positive electrode for the semiconductor light-emitting device according to claim 1, wherein the adhesion strength between the reflecting layer and the transparent electrode is not less than 490 mN (50 gf) as a peel strength.

3. The positive electrode for the semiconductor light-emitting device according to claim 1, wherein the transparent electrode has a transmissibility of 60% to light having a wavelength falling within an emission wavelength range of the semiconductor light-emitting device.

4. The positive electrode for the semiconductor light-emitting device according to claim 1, wherein the reflecting layer is composed of a metal selected from the group consisting of Al, Ag, Pt-group metals, and alloys containing at least one metal of Al, Ag, and Pt-group metals.

5. The positive electrode for the semiconductor light-emitting device according to claim 1, wherein the semiconductor light-emitting device is a gallium-nitride-based compound semiconductor light-emitting device.

6. The positive electrode for the semiconductor light-emitting device according to claim 1, wherein the reflecting layer is composed of a metal selected from the group consisting of Al, Ag, Pt, and alloys containing at least one metal of Al, Ag, and Pt.

7. The positive electrode for the semiconductor light-emitting device according to claim 1, wherein the reflecting layer has a thickness of 20 to 3,000 nm.

8. The positive electrode for the semiconductor light-emitting device according to claim 1, wherein the bonding pad electrode has a layer structure and includes, in addition to the reflecting layer, a barrier layer composed of Ti, Cr, or Al, and/or an uppermost layer composed of Au or Al.

9. The positive electrode for the semiconductor light-emitting device according to claim 1, wherein the transparent electrode includes, on the bonding pad electrode side, a layer composed of a metal.

10. The positive electrode for the semiconductor light-emitting device according to claim 1, wherein the transparent electrode includes, on the bonding pad electrode side, a layer composed of a transparent material.

11. The positive electrode for the semiconductor light-emitting device according to claim 10, wherein the transparent electrode consists of only a conductive transparent material other than a metal.

12. The positive electrode for the semiconductor light-emitting device according to claim 10, wherein the transparent material is at least one substance selected from the group consisting of ITO, zinc oxide, zinc aluminum oxide, F-doped tin oxide, titanium oxide, zinc sulfide, bismuth oxide and magnesium oxide.

13. The positive electrode for the semiconductor light-emitting device according to claim 12, wherein the transparent material is at least one substance selected from the group consisting of ITO, zinc oxide, zinc aluminum oxide and F-doped tin oxide.

14. The positive electrode for the semiconductor light-emitting device according to claim 10, wherein the transparent material has a thickness of 10 to 5,000 nm.

15. The positive electrode for the semiconductor light-emitting device according to claim 14, wherein the transparent material has a thickness of 100 to 1,000 nm.

16. The positive electrode for the semiconductor light-emitting device according to claim 1, wherein a process to extract emission light is performed on an uppermost surface of the transparent electrode.

17. The positive electrode for the semiconductor light-emitting device according to claim 12, wherein an uppermost surface of the transparent electrode is formed of a transparent material.

18. The positive electrode for the semiconductor light-emitting device according to claim 1, wherein the transparent electrode has a contact layer that is in contact with a p-type semiconductor layer, and a current diffusion layer that is provided on the contact layer.

19. The positive electrode for the semiconductor light-emitting device according to claim 18, wherein the contact layer is composed of a platinum-group metal or an alloy thereof.

20. The positive electrode for the semiconductor light-emitting device according to claim 19, wherein the contact layer is composed of platinum.

21. The positive electrode for the semiconductor light-emitting device according to claim 18, wherein the contact layer has a thickness of 0.1 to 7.5 nm.

22. The positive electrode for the semiconductor light-emitting device according to claim 21, wherein the contact layer has a thickness of 0.5 to 2.5 nm.

23. The positive electrode for the semiconductor light-emitting device according to claim 18, wherein the current diffusion layer is composed of a metal selected from the group consisting of gold, silver, and copper, or of an alloy containing at least one metal of gold, silver, and copper.

24. The positive electrode for the semiconductor light-emitting device according to claim 23, wherein the current diffusion layer is composed of gold or a gold alloy.

25. The positive electrode for the semiconductor light-emitting device according to claim 18, wherein the current diffusion layer has a thickness of 1 to 20 nm.

26. The positive electrode for the semiconductor light-emitting device according to claim 25, wherein the current diffusion layer has a thickness of 3 to 6 nm.

27. The positive electrode for the semiconductor light-emitting device according to claim 18, wherein the current diffusion layer is composed of a conductive transparent material.

28. A semiconductor light-emitting device employing a positive electrode according to claim 1.

29. A lamp employing a light-emitting device according to claim 28.

30. A gallium-nitride-based compound semiconductor light-emitting device comprising a substrate; an n-type semiconductor layer, a light-emitting layer, and a p-type semiconductor layer, the layers being stacked on the substrate in this order and formed of a gallium-nitride-based compound semiconductor layer; a positive electrode provided on the p-type semiconductor layer; and a negative electrode provided on the n-type semiconductor layer, wherein the positive electrode is a positive electrode according to claim 1.

* * * * *